(12) United States Patent
Xu

(10) Patent No.: US 8,230,904 B2
(45) Date of Patent: Jul. 31, 2012

(54) HEAT DISSIPATION DEVICE HAVING A FAN DUCT THEREON

(75) Inventor: Hong-Bo Xu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 514 days.

(21) Appl. No.: 12/472,391

(22) Filed: May 27, 2009

(65) Prior Publication Data
US 2010/0258271 A1   Oct. 14, 2010

(30) Foreign Application Priority Data
Apr. 8, 2009   (CN) .......................... 2009 1 0301437

(51) Int. Cl.
*F28F 7/00* (2006.01)
*H01L 23/467* (2006.01)
*H05K 7/20* (2006.01)

(52) U.S. Cl. ........ 165/80.3; 165/121; 361/697; 361/704

(58) Field of Classification Search .................. 165/185, 165/80.3, 121; 361/704, 710, 679.47, 697
See application file for complete search history.

(56) References Cited

U.S. PATENT DOCUMENTS

| | | | | |
|---|---|---|---|---|
| 6,717,814 B2* | 4/2004 | Li | ................... | 361/704 |
| 7,509,997 B2* | 3/2009 | Lin et al. | ...................... | 165/80.3 |
| 2006/0061966 A1* | 3/2006 | Korinsky et al. | ............... | 361/695 |

* cited by examiner

*Primary Examiner* — Allen J. Flanigan
*Assistant Examiner* — Jason Thompson
(74) *Attorney, Agent, or Firm* — Altis Law Group, Inc.

(57) ABSTRACT

A heat dissipation device includes a heat sink, a fan placed on a top of the heat sink for providing an airflow through the heat sink and a fan duct located at a side of the heat sink. The heat sink includes a plurality of upwardly extending first fins and a plurality of laterally extending second fins located below the first fins. A plurality of first airflow channels are defined in the adjacent first fins and a plurality of second airflow channels are defined in the adjacent second fins. The fan duct guides a significant part of the airflow produced by the fan to the second airflow channels from a lateral side of the heat sink to have a sufficient contact with the second fins of the heat sink.

8 Claims, 4 Drawing Sheets

HEAT DISSIPATION DEVICE HAVING A FAN DUCT THEREON

BACKGROUND

1. Technical Field

The disclosure relates to a heat dissipation device, and more particularly to a heat dissipation device having a heat sink and a fan duct thereon.

2. Description of Related Art

Generally, in order to ensure the normal running of an electronic device, a heat dissipation device is used to dissipate heat generated by the electronic device. A conventional heat dissipation device includes a heat sink and a fan attached on the heat sink to improve a heat-dissipation capacity of the heat sink.

Sometimes, the heat sink includes a plurality of first fins defining a plurality of first airflow channels therebetwwen and a plurality of second fins defining second airflow channels therebetwwen. The fan directly faces the first airflow channels and is located back to the second airflow channels, whereby airflow produced by the fan cannot enter the second airflow channels and heat of the second fins fails to quickly dissipate. Accordingly, heat-dissipation efficiency of the whole the heat sink is poor.

What is needed, therefore, is an LED lamp which can overcome the limitations described.

BRIEF DESCRIPTION OF THE DRAWINGS

Other advantages and novel features of the disclosure will become more apparent from the following detailed description of an embodiment/embodiments when taken in conjunction with the accompanying drawings.

DETAILED DESCRIPTION

Referring to FIGS. 1-4, a heat dissipation device in accordance with an exemplary embodiment of the disclosure is shown. The heat dissipation device is mounted to a heat-generating electronic element (not shown) to dissipate heat from the heat-generating electronic element. The heat dissipation device comprises a heat sink 10, a fan 20 mounted on a top of the heat sink 10 and a fan duct 30 located at a front side of the heat sink 10.

Figure 2:
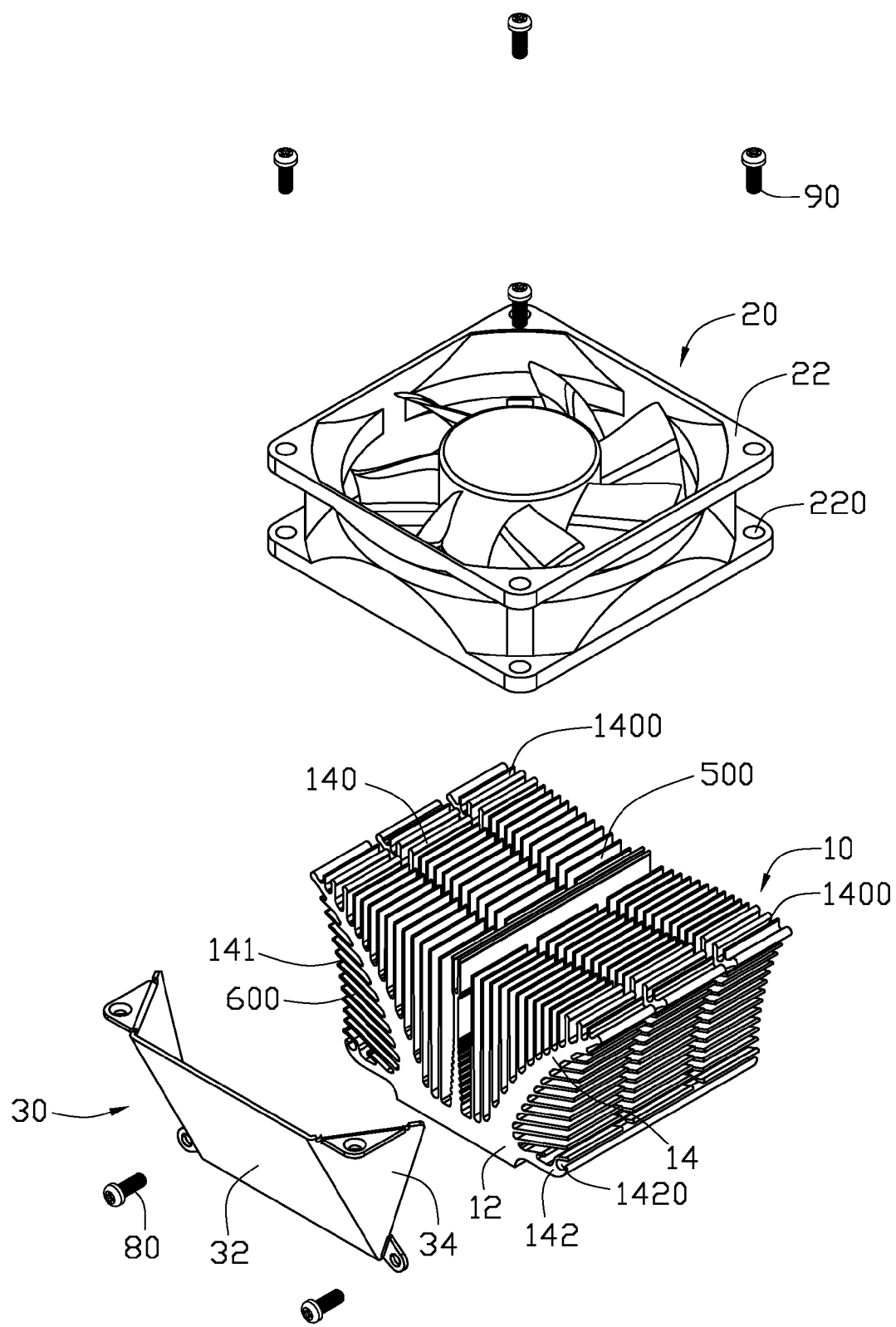
FIG. 2 is an exploded, isometric view of FIG. 1.
Figure 3:
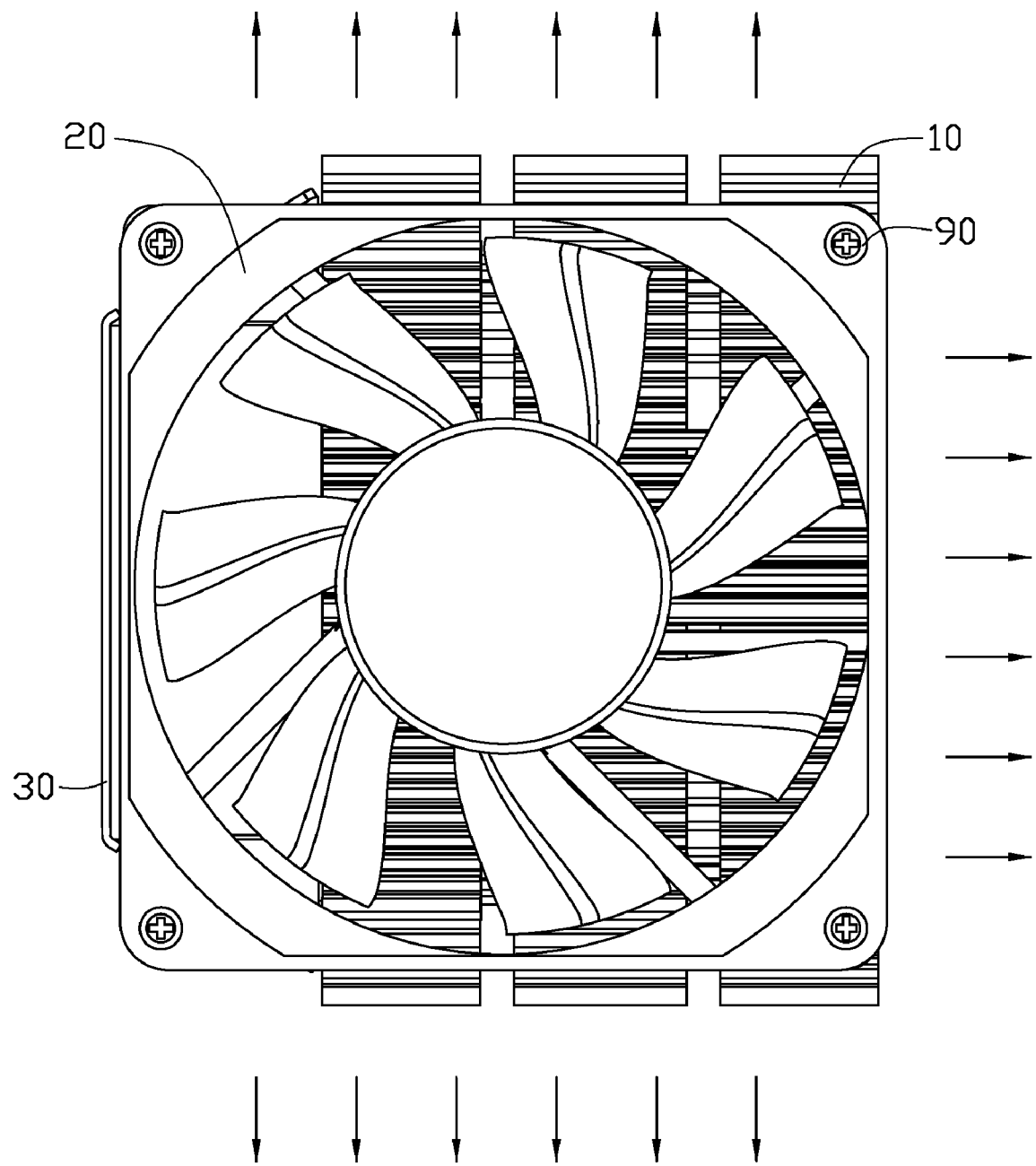
FIG. 3 is a top view of FIG. 1, with arrows showing paths of airflow leaving the heat dissipation device.

The heat sink 10 is integrally formed by aluminum extrusion. The heat sink 10 comprises a rectangular base plate 12 thermally in contact with the heat-generating electronic element and two arched conducting arms 14 extending obliquely from the base plate 12. The conducting arms 14 extend upwardly and obliquely from the base plate 12 away from each other. Each of the conducting arms 14 forms a plurality of first fins 140 extending upwardly from an inner surface thereof, and a plurality of second fins 141 extending outwardly from an outer surface thereof. The first fins 140 are vertical to the base plate 12 and the second fins 141 are parallel to each other and inclinedly upward. The second fins 141 are located below the first fins 140 whereby the first fins 140 are located between the second fins 141 and the fan 20. Two fixing slots 1400 each are defined by two adjacent first fins 140 at a top of each of the conducting arms 14, located at a rear side of the heat sink 10 for engagingly receiving two fixing members 90 vertically screwing into the two fixing slots 1400 to secure the fan 20 to the top of the heat sink 10. Two mounting slots 1420 each are formed at a front end of each of the bottommost second fins 142, for engagingly receiving two fixing members 80 horizontally screwing into the mounting slots 1420 to secure the fan duct 30 to the front side of the heat sink 10. A plurality of first airflow channels 500 are defined in the adjacent first fins 140 and face upward to the fan 20, allowing cooling airflow produced by the fan 20 to blow downwardly into the first fins 140. A plurality of second airflow channels 600 are defined in the adjacent second fins 141, which face toward lateral sides of the heat sink 10. In one embodiment, the heat sink has four lateral sides (as shown in FIG. 2) The second airflow channels 600 are blocked from a significant part of the cooling airflow produced by the fan 20 by the conducting arms 14, if the fan duct 30 is not provided to the heat dissipation device.

The fan 20 has a pair of frames 22 with a shape and size corresponding to that of the top of the heat sink 10. The lower frame 22 defines a plurality of through orifices 220 in corners thereof, for engaging with the fixing members 90 to secure the fan 20 to the top of the heat sink 10.

Figure 1:
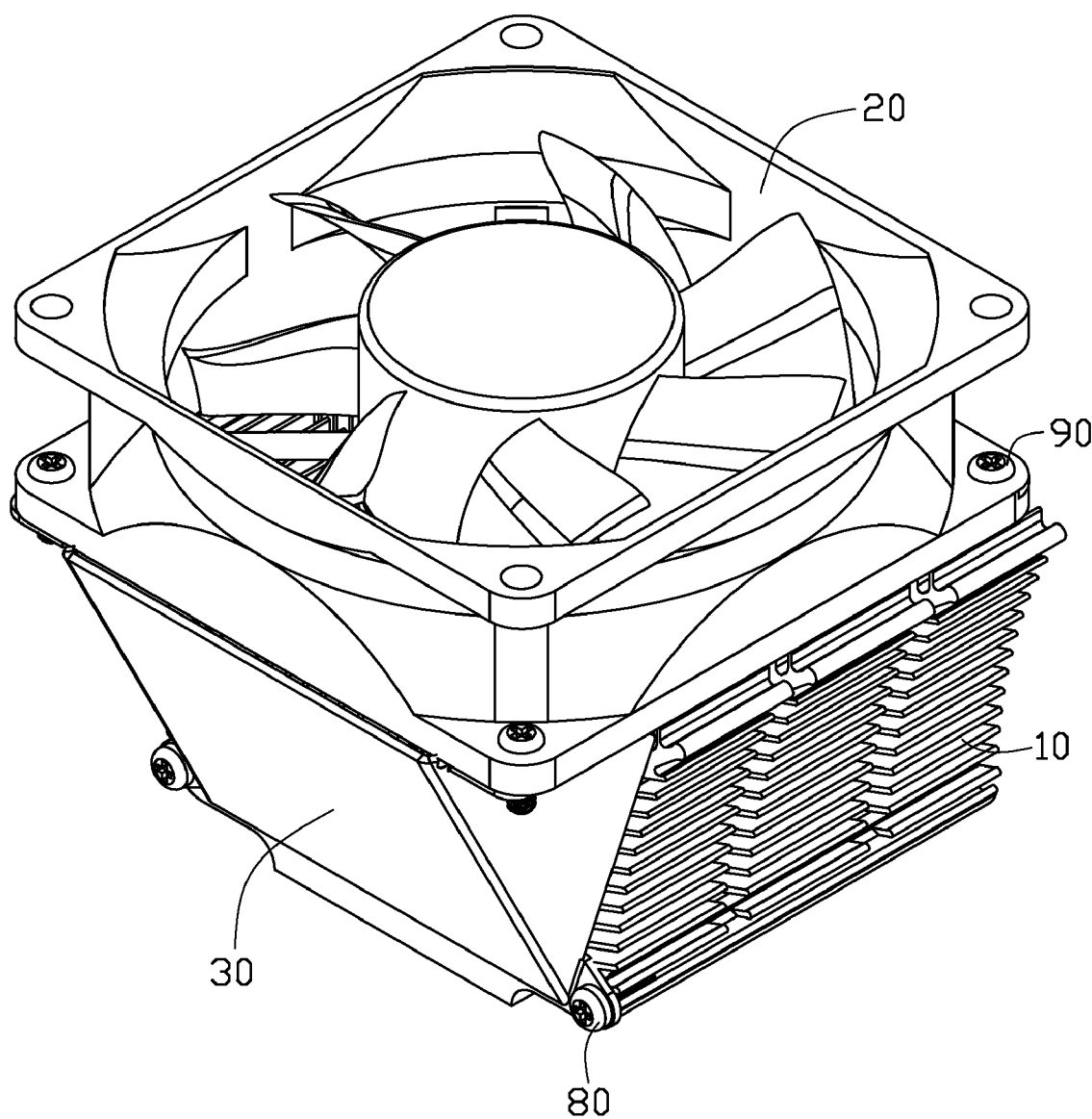
FIG. 1 is an assembled view of a heat dissipation device in accordance with an exemplary embodiment of the disclosure.
Figure 4:
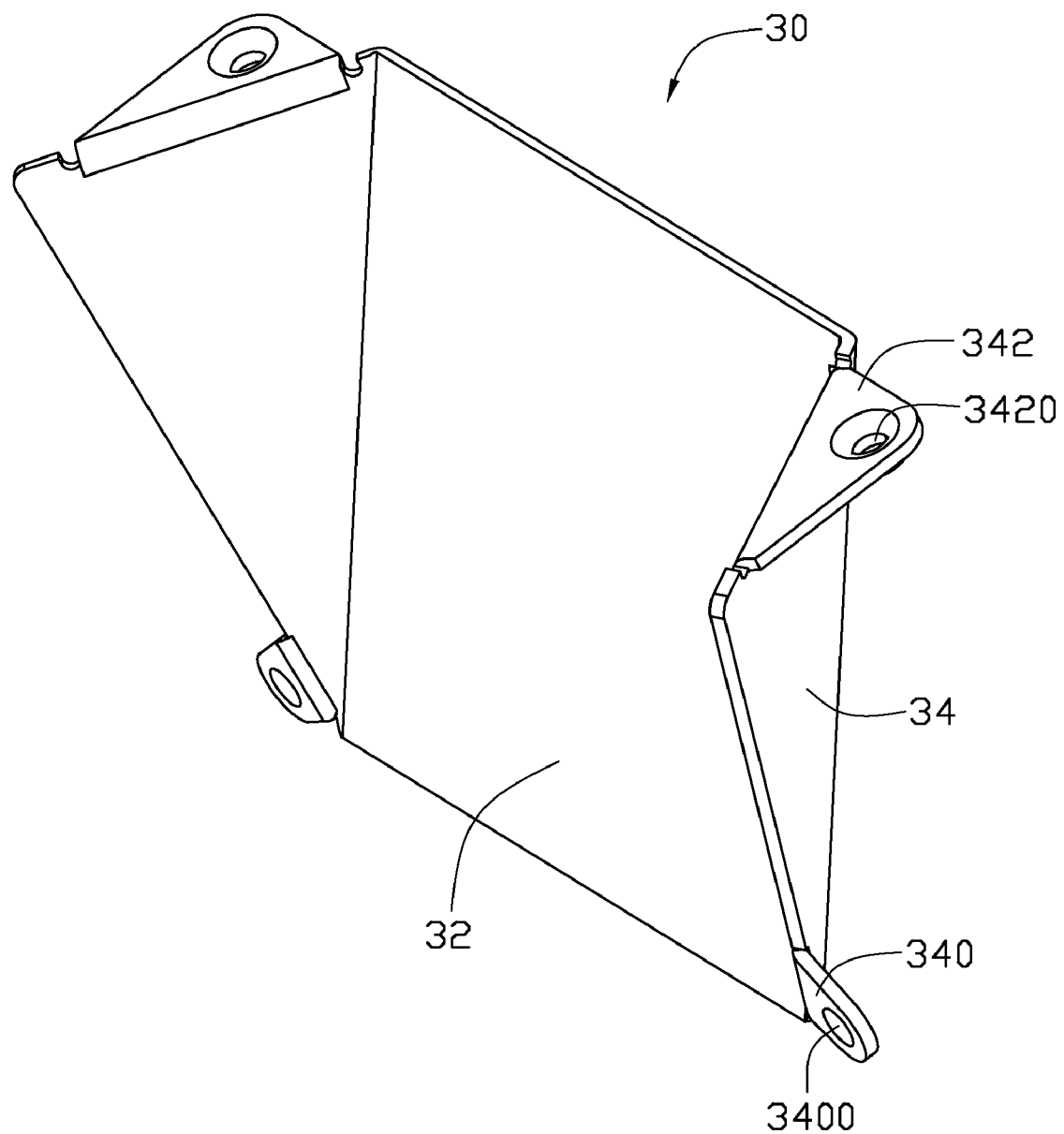
FIG. 4 is an enlarged view of a fan duct of the heat dissipation device of FIG. 1.

As shown in FIG. 4, the fan duct 30 comprises a rectangular main body 32 and a pair of trigonal baffles 34 extending rearward, outwardly and obliquely from two opposite lateral sides of the main body 32. The baffles 34 each comprise a mounting leg 340 extending outwardly from a bottom thereof and a fixing ear 342 extending outwardly and horizontally from a top thereof. A through hole 3400 is defined in a corresponding mounting leg 340 and in alignment with a corresponding mounting slot 1420 of the bottommost second fin 142 of the heat sink 10, for engaging with the fixing member 80 to secure the fan duct 30 to the front side of the heat sink 10. The fan duct (30) is attached to the heat sink (10) such that a bottom of the main body 32 of said fan duct is attached to a bottom of the heat sink at one of the four lateral sides of the heat sink (as shown in FIG. 1) A fixing hole 3420 is defined in a corresponding fixing ear 342 and in alignment with a corresponding through orifice 220 of the lower frame 22 of the fan 20 for engaging with the fixing member 90 to secure the fan duct 30 to a front side of the lower frame 22 of the fan 20. When the fan duct 30 is secured to the front side of the heat sink 10, the main body 32 of the fan duct 30 is located slantwise outwardly relative to a bottom of the base plate 12 of the heat sink 10, whereby the fan duct 30 and the front side of the heat sink 10 cooperatively define a space to allow the cooling airflow of the fan 20 to pass therethrough.

In use, a part of the cooling airflow produced by the fan 20 directly blows towards the first airflow channels 500 to sufficiently contact the first fins 140 of the heat sink 10, and another part of the cooling airflow is guided by the fan duct 30 to blow towards the second airflow channels 600 from the front side of the heat sink 10 to sufficiently contact the second fins 141 of the heat sink 10. The cooling airflow produced by the fan 20 leaves away the heat sink 10 from three directions of the heat sink 10 as shown in FIG. 4. The second fins 141 of the heat sink 10 which are located remote from the fan 20 have a sufficiently contact with the cooling airflow of the fan 20 to improve heat-dissipation efficiency of the whole heat sink 10.

It can be easily understood, a configuration of the heat sink 10 is not restricted to the disclosed embodiment only. The heat sink 10 can be any other types in case the heat sink 10 comprises first fins defining first airflow channels facing upwardly toward the fan 20 and second fins defining second airflow channels remote from the fan and facing toward lateral sides of the heat sink. The fan fails to directly blow towards the second airflow channels.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a fan for generating airflow;
   a heat sink comprising a top on which the fan is mounted, a bottom opposite to the top for contacting a heat-generating component to absorb heat, and a four lateral sides between the top and the bottom, a plurality of first fins extending upwardly towards the fan and a plurality of second fins located below tops of the first fins and extending toward two of the four lateral sides of the heat sink, the plurality of first fins defining a plurality of first airflow channels therebetween, and the plurality of second fins defining a plurality of second airflow channels therebetween; and
   a fan duct located at another one of the four lateral sides of the heat sink and guiding a part of the airflow of the fan to enter the second airflow channels of the heat sink from the another one of the four lateral sides of the heat sink wherein the fan duct comprises a main body and a pair of baffles, a bottom of the main body is attached to the bottom of the heat sink at the another one of the four lateral sides of the heat sink, a top of the main body is attached to a bottom side of the fan which faces the top of the heat sink, the top of the main body is spaced from the another one of the four lateral sides of the heat sink, the baffles extend from opposite lateral edges of the main body to lateral edges of the another one of the four lateral sides of the heat sink, a space is defined between the main body, the baffles and the another one of the four lateral sides of the heat sink for the part of the airflow of the fan to pass therethrough and enter the second airflow channels of the heat sink, and the main body is inclined outwardly relative to the bottom of the heat sink.

2. The heat dissipation device of claim 1, wherein the plurality of first fins of the heat sink are vertical to the bottom of the heat sink and the plurality of second fins are parallel to each other and oriented inclinedly upward.

3. The heat dissipation device of claim 2, wherein the heat sink comprises a pair of conducting arms extending from the bottom of the heat sink and away from each other and the plurality of first fins extend from an inner surface of each of the conducting arms and the plurality of second fins extend from an outer surface of each of the conducting arms.

4. The heat dissipation device of claim 1, wherein each of the baffles of the fan duct comprises a mounting leg engaging with one bottommost second fin of the heat sink and a fixing ear engaging with a lower frame of the fan.

5. The heat dissipation device of claim 4, wherein the bottommost second fins of the heat sink each define a mounting slot engagingly receiving a corresponding mounting leg of the fan duct.

6. The heat dissipation device of claim 5, wherein the lower frame of the fan defines two through orifices, each through orifice engagingly receiving a corresponding fixing ear of the fan duct.

7. The heat dissipation device of claim 3, wherein the heat sink defines a pair of fixing slots each being at a top of each of the conducting arms.

8. The heat dissipation device of claim 7, wherein the heat sink comprises a base plate, and the conducting arms extend obliquely and upwardly from the base plate.

* * * * *